United States Patent
Moon

(10) Patent No.: US 11,249,681 B2
(45) Date of Patent: Feb. 15, 2022

(54) MEMORY CONTROLLER AND STORAGE DEVICE HAVING THE SAME

(71) Applicant: SK hynix Inc., Icheon (KR)

(72) Inventor: Ho Chan Moon, Seongnam (KR)

(73) Assignee: SK HYNIX INC., Icheon (KR)

( * ) Notice: Subject to any disclaimer, the term of this patent is extended or adjusted under 35 U.S.C. 154(b) by 84 days.

(21) Appl. No.: 16/712,781

(22) Filed: Dec. 12, 2019

(65) Prior Publication Data

US 2020/0379682 A1    Dec. 3, 2020

(30) Foreign Application Priority Data

May 30, 2019   (KR) ........................ 10-2019-0064081

(51) Int. Cl.
*G06F 3/06*      (2006.01)

(52) U.S. Cl.
CPC ............ *G06F 3/0659* (2013.01); *G06F 3/061* (2013.01); *G06F 3/0653* (2013.01); *G06F 3/0679* (2013.01)

(58) Field of Classification Search
CPC ...... G06F 3/0659; G06F 3/061; G06F 3/0653; G06F 3/0679
USPC ........................................................ 711/103
See application file for complete search history.

(56) References Cited

U.S. PATENT DOCUMENTS

| | | | |
|---|---|---|---|
| 2010/0293393 A1* | 11/2010 | Park | G06F 12/0246 713/193 |
| 2013/0013854 A1* | 1/2013 | Mun | G11C 16/0483 711/103 |
| 2014/0037086 A1* | 2/2014 | Seol | H04L 9/0869 380/44 |
| 2014/0313835 A1* | 10/2014 | Lee | G11C 7/02 365/185.18 |

FOREIGN PATENT DOCUMENTS

| | | |
|---|---|---|
| KR | 20140017290 A | 2/2014 |
| KR | 101540875 B1 | 7/2015 |
| KR | 20170111386 A | 10/2017 |

* cited by examiner

*Primary Examiner* — Gautam Sain

(57) ABSTRACT

A memory controller includes a random data generator configured to generate first random data based on write data and a first seed, the write data for storing in a selected page in a memory device; and a bit pattern determiner configured to generate data distribution information indicating whether the random data is a first type or a second type. The random data generator generates second random data when the data distribution information indicates the second type, the second random data being different from the first random data.

20 Claims, 15 Drawing Sheets

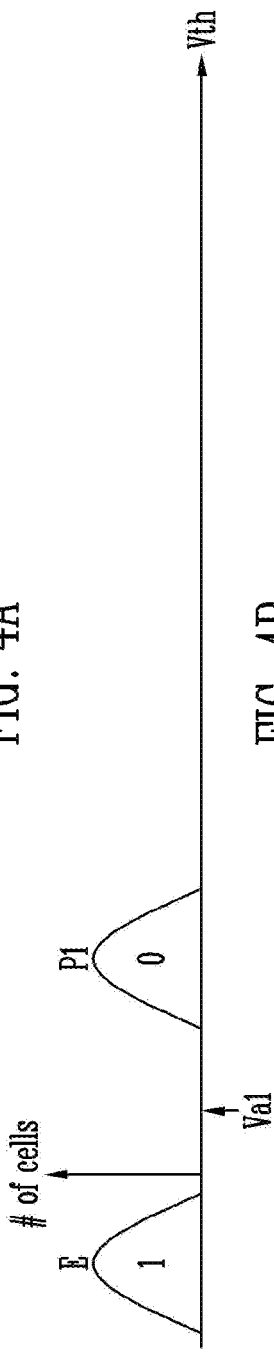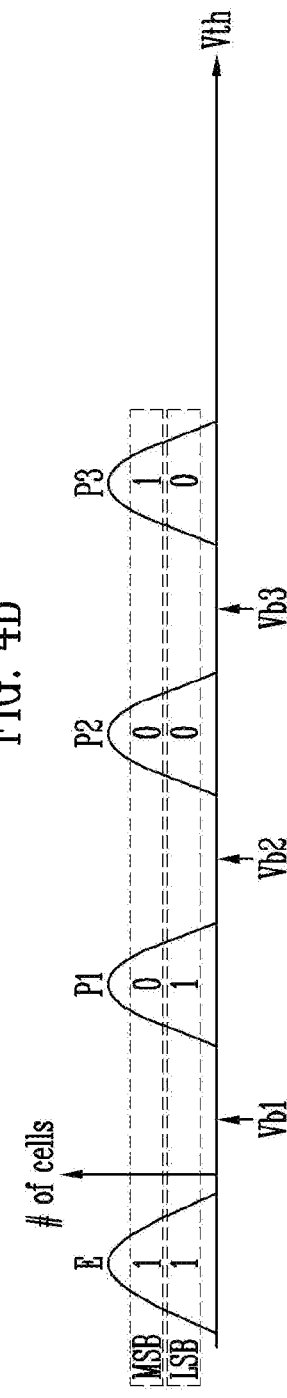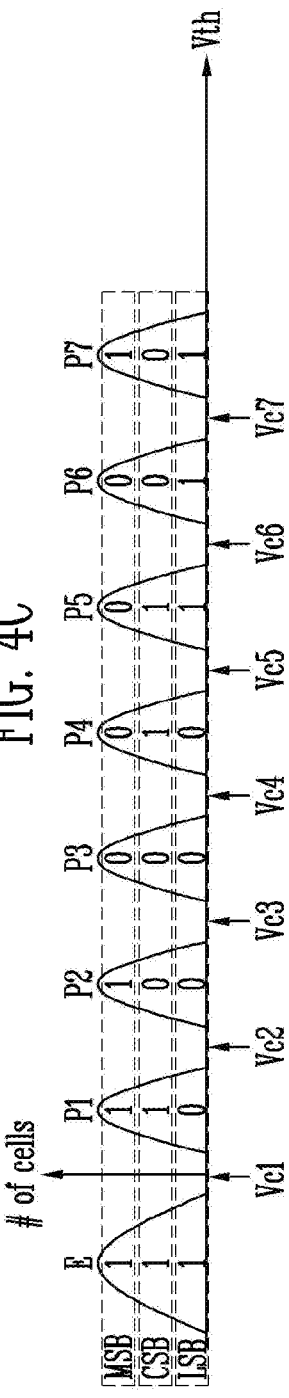

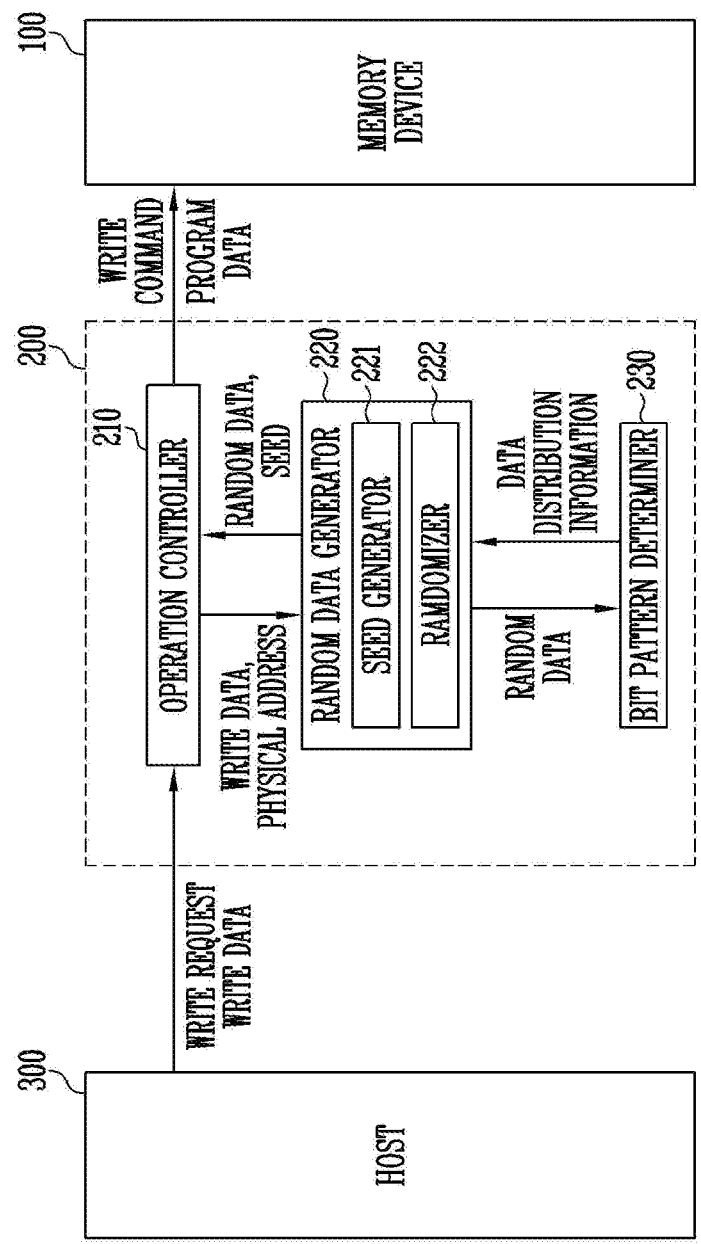

FIG. 7

| DATA CODE | | | |
|---|---|---|---|
| E | P1 | P2 | P3 |
| 11 | 01 | 00 | 10 |

WRITE DATA → 01:01001:01:01001:01:01001:01
P1 | P1 | P2 | P3 | P1 | P2 | P3 | P1 | P2 | P3 | P1

| E | P1 | P2 | P3 |
|---|---|---|---|
| 0% | 50% | 25% | 25% |
| (0/12) | (6/12) | (3/12) | (3/12) |

| E | P1 | P2 | P3 |
|---|---|---|---|
| 25% | 25% | 25% | 25% |
| (3/12) | (3/12) | (3/12) | (3/12) |

REFERENCE DISTRIBUTION RATIO

RD2 → 01:01001:01:11001:01:11001:10
P1 | P1 | P2 | P3 | E | P1 | P2 | P3 | E | P1 | P2 | P3

| E | P1 | P2 | P3 |
|---|---|---|---|
| 16.7% | 33.3% | 25% | 25% |
| (2/12) | (4/12) | (3/12) | (3/12) |

ABNORMAL DISTRIBUTION RATIO

FIG. 9

| PHYSICAL ADDRESS | SEED | WRITE DATA | RANDOM DATA |
|---|---|---|---|
| PPN1 | Seed1 | Write D1 | RD1 | → ABNORMAL DISTRIBUTION
| PPN2 | Seed2 | Write D1 | RD2 |
| PPN3 | Seed3 | Write D1 | RD3 |

GENERATE SEED DIFFERENT FROM Seed1 BASED ON PHYSICAL ADDRESS DIFFERENT FROM PPN1

FIG. 10

| PHYSICAL ADDRESS | SEED | WRITE DATA | RANDOM DATA |
|---|---|---|---|
| PPN1 | Seed1 + Preset Value ⇒ Seed2 | Write D1 | RD1 | → ABNORMAL DISTRIBUTION GENERATE SEED DIFFERENT FROM Seed1 USING Seed1 AND PRESET VALUE

MEMORY CONTROLLER AND STORAGE DEVICE HAVING THE SAME

CROSS-REFERENCE TO RELATED APPLICATION

The present application claims priority under 35 U.S.C. § 119(a) to Korean patent application number 10-2019-0064081 filed on May 30, 2019, which is incorporated by reference in its entirety.

BACKGROUND

1. Field of Invention

The present disclosure relates to an electronic device, and more particularly, to a memory controller and a storage device having the same.

2. Description of Related Art

A storage device is a device that stores data under control of a host device such as a computer or a smartphone. A storage device may include a memory device in which data is stored and a memory controller controlling the memory device. The memory device is divided into a volatile memory device and a non-volatile memory device.

The volatile memory device is a device that stores data only when power is supplied and loses the stored data when the power supply is cut off. The volatile memory device includes a static random access memory (SRAM), a dynamic random access memory (DRAM), and the like.

The non-volatile memory device is a device that does not lose data even when power is cut off. The non-volatile memory device include a read only memory (ROM), a programmable ROM (PROM), an electrically programmable ROM (EPROM), an electrically erasable and programmable ROM (EEPROM), a flash memory, and the like.

SUMMARY

An embodiment of the present disclosure provides a memory controller having improved randomizing performance and a storage device having the memory controller.

A memory controller according to an embodiment of the present disclosure controls a memory device including a plurality of pages. The memory controller includes a random data generator and a bit pattern determiner. The random data generator generates random data based on write data to be stored in a selected page of the plurality of pages and a first seed. The bit pattern determiner generates data distribution information indicating whether the random data is a normal distribution or an abnormal distribution based on a result of comparison between a distribution ratio of bit patterns of the random data with a reference distribution ratio. The random data generator regenerates the random data based on the write data and a second seed different from the first seed, according to the data distribution information. The second seed may be determined based on a physical address of a page different from the selected page among target pages including the selected page on which a sequential write operation is performed, or based on the first seed and a preset value.

A method of operating a memory controller that controls a memory device including a plurality of pages according to an embodiment of the present disclosure includes receiving a write request and write data to be stored in a selected page of the plurality of pages from a host, generating random data based on the write data and a first seed, generating data distribution information indicating whether the random data is a normal distribution or an abnormal distribution based on a result of comparison between a distribution ratio of bit patterns of the random data with a reference distribution ratio, regenerating the random data based on the write data and a second seed different from the first seed, according to the data distribution information, and providing a program command for storing the random data and a seed corresponding to the random data in the selected page, to the memory device. The second seed may be determined based on a physical address of a page different from the selected page among target pages including the selected page on which a sequential write operation is performed, or based on the first seed and a preset value.

A storage device according to an embodiment of the present disclosure includes a memory device including a plurality of pages and a memory controller. The memory controller generates random data based on write data to be stored in a selected page of the plurality of pages and a first seed, generates data distribution information indicating whether the random data is a normal distribution or an abnormal distribution based on a result of comparison between a distribution ratio of bit patterns of the random data with a reference distribution ratio, and regenerates the random data based on the write data and a second seed different from the first seed, according to the data distribution information. The second seed may be determined based on a physical address of a page different from the selected page among target pages including the selected page on which a sequential write operation is performed, or based on the first seed and a preset value.

According to the present technology, a storage device having improved randomizing performance and a method of operating the storage device are provided.

BRIEF DESCRIPTION OF THE DRAWINGS

FIG. 4A to FIG. 4C illustrate diagrams for describing a threshold voltage distribution according to the number of data bits stored in a memory cell.

FIG. 5 illustrates a block diagram for describing a configuration and an operation of a memory controller of FIG. 1 according to an embodiment.

FIG. 7 illustrates a diagram for describing a distribution ratio of bit patterns of a data code and write data of FIG. 6.

FIG. 8 illustrates a diagram for describing an operation of determining whether or not random data is abnormal.

FIG. 9 illustrates a diagram for describing an operation of a seed generator of FIG. 5 according to an embodiment.

FIG. 10 illustrates a diagram for describing the operation of the seed generator of FIG. 5 according to another embodiment.

DETAILED DESCRIPTION

Hereinafter, an embodiment of the present disclosure will be described in detail with reference to the accompanying drawings.

Figure 1:
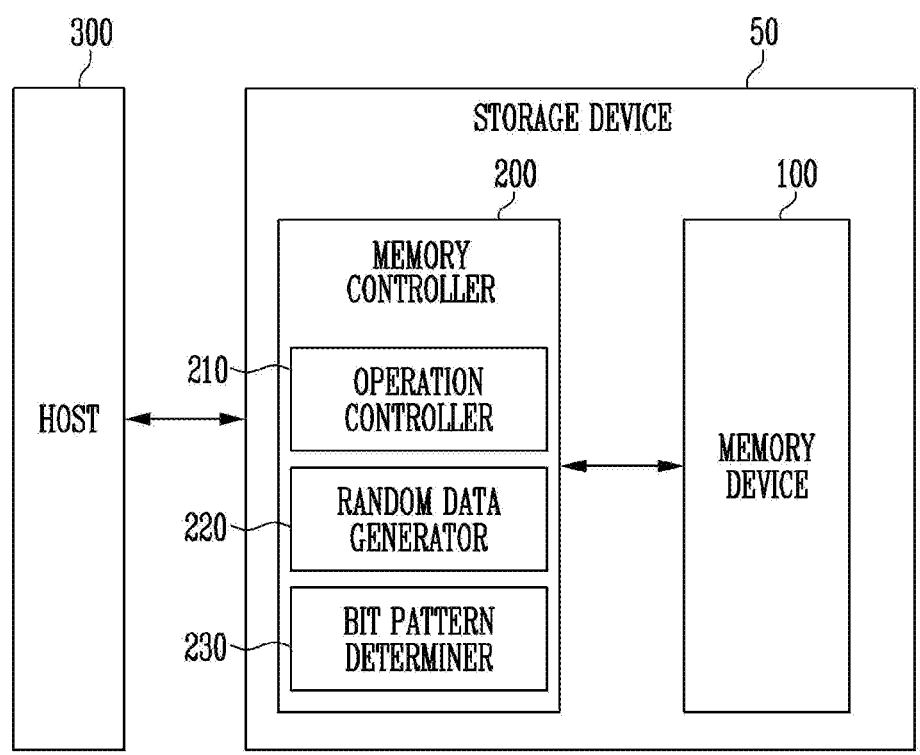
FIG. 1 illustrates a block diagram for describing a storage device according to an embodiment of the present disclosure.

FIG. 1 illustrates a block diagram for describing a storage device according to an embodiment of the present disclosure. The storage device 50 may include a memory device 100 and a memory controller 200 controlling an operation of the memory device 100. The storage device 50 is a device that stores data under control of a host 300 such as a cellular phone, a smartphone, an MP3 player, a laptop computer, a desktop computer, a game player, a TV, a tablet PC, or an in-vehicle infotainment system.

The storage device 50 may be manufactured as one of various types of storage devices according to a host interface that is a communication method with the host 300. For example, the storage device 50 may be configured as any one of various types of storage devices such as an SSD, a multimedia card in a form of an MMC, an eMMC, an RS-MMC and a micro-MMC, a secure digital card in a form of an SD, a mini-SD and a micro-SD, a universal serial bus (USB) storage device, a universal flash storage (UFS) device, a personal computer memory card international association (PCMCIA) card type storage device, a peripheral component interconnection (PCI) card type storage device, a PCI express (PCI-E) card type storage device, a compact flash (CF) card, a smart media card, and a memory stick.

The storage device 50 may be manufactured as any one of various types of packages. For example, the storage device 50 may be manufactured as any one of various types of package types, such as a package on package (POP), a system in package (SIP), a system on chip (SOC), a multi-chip package (MCP), a chip on board (COB), a wafer-level fabricated package (WFP), and a wafer-level stack package (WSP).

The memory device 100 may store data. The memory device 100 operates in response to control of the memory controller 200. The memory device 100 may include a memory cell array including a plurality of memory cells storing the data.

Each of the memory cells may be configured as a single level cell (SLC) that stores one data bit, a multi-level cell (MLC) that stores two data bits, a triple level cell (TLC) that stores three data bits, or a quad level cell (QLC) that stores four data bits.

The memory cell array may include a plurality of memory blocks. Each of the memory blocks may include a plurality of memory cells. One memory block may include a plurality of pages. In an embodiment, a page may be a unit for storing data in the memory device 100 or reading data stored in the memory device 100.

More specifically, the memory block may include a plurality of word lines. Memory cells may be connected to each word line. Memory cells connected to the same word line may be defined as one physical page. At least one logical page may correspond to one physical page according to the number of data bits the memory cell stores.

For example, when the memory cell is a single level cell storing one data bit, one logical page may correspond to one physical page. When the memory cell is a multi-level cell storing two data bits, two logical pages may correspond to one physical page. The two logical pages may be an MSB page storing the most significant bit data and an LSB page storing the least significant bit data.

The memory block may be a unit for erasing data. In an embodiment, the memory device 100 may be a double data rate synchronous dynamic random access memory (DDR SDRAM), a low power double data rate4 (LPDDR4) SDRAM, a graphics double data rate (GDDR) SDRAM, a low power DDR (LPDDR), a Rambus dynamic random access memory (RDRAM), a NAND flash memory, a vertical NAND flash memory, a NOR flash memory device, a resistive random access memory (RRAM), a phase-change memory (PRAM), a magnetoresistive random access memory (MRAM), a ferroelectric random access memory (FRAM), a spin transfer torque random access memory (STT-RAM), or the like. In the present specification, for convenience of description, it is assumed that the memory device 100 is a NAND flash memory.

The memory device 100 is configured to receive a command and an address from the memory controller 200 and access an area selected by the address in the memory cell array. That is, the memory device 100 may perform an operation instructed by the command on the area selected by the address. For example, the memory device 100 may perform a write operation (program operation), a read operation, and an erase operation. During the program operation, the memory device 100 may program data to the area selected by the address. During the read operation, the memory device 100 may read data from the area selected by the address. During the erase operation, the memory device 100 may erase data stored in the area selected by the address.

The memory controller 200 controls overall operations of the storage device 50.

When power is applied to the storage device 50, the memory controller 200 may execute firmware FW. When the memory device 100 is a flash memory device, the memory controller 200 may operate firmware such as a flash translation layer (FTL) for controlling communication between the host 300 and the memory device 100.

In an embodiment, the memory controller 200 may receive data and a logical block address (LBA) from the host 300 and convert the logical block address (LBA) into a physical block address (PBA) indicating an address of memory cells in which data included in the memory device 100 is to be stored.

The memory controller 200 may control the memory device 100 to perform the program operation, the read operation, or the erase operation in response to a request from the host 300. During the program operation, the memory controller 200 may provide a program command, a physical block address, and data to the memory device 100. During the read operation, the memory controller 200 may provide a read command and the physical block address to the memory device 100. During the erase operation, the memory controller 200 may provide an erase command and the physical block address to the memory device 100.

In an embodiment, the memory controller 200 may generate and transmit the command, the address, and the data to the memory device 100 regardless of the request from the host 300. For example, the memory controller 200 may provide a command, an address, and data to the memory device 100 so as to perform background operations such as a program operation for wear leveling and a program operation for garbage collection.

In an embodiment, the memory controller 200 may control at least two memory devices 100. In this case, the memory controller 200 may control the memory devices 100 according to an interleaving method so as to improve operation performance. The interleaving method may be an operation method for overlapping operation periods of at least two memory devices 100.

In an embodiment, the memory controller 200 may include an operation controller 210, a random data generator 220, and a bit pattern determiner 230.

The operation controller 210 may receive a write request and write data from the host 300.

The operation controller 210 may convert a logical address of the write data received from the host 300 into a physical address. The operation controller 210 may provide the write data and a physical address of a page in which the write data is to be stored to the random data generator 220.

The operation controller 210 may control the memory device 100 to store a program data including the random data and a seed provided from the random data generator 220 in a selected page.

The operation controller 210 may receive a read request for the selected page from the host 300. The operation controller 210 may control the memory device 100 to read the selected page. The operation controller 210 may provide random data included in data from which the selected page is read and restoration data generated based on a seed corresponding to the random data.

The random data generator 220 may generate the seed based on the physical address provided from the operation controller 210. The random data generator 220 may generate random data obtained by randomizing the write data using the seed. The random data generator 220 may provide the generated random data to the bit pattern determiner 230.

The random data generator 220 may determine whether the random data is a normal distribution (or first type) or an abnormal distribution (or second type) according to data distribution information of the random data provided from the bit pattern determiner 230.

The random data generator 220 may provide the random data and the seed corresponding to the random data to the operation controller 210 when the random data is the normal distribution. The seed corresponding to the random data may be a seed used in generation of the random data. The random data generator 220 may regenerate the random data when the random data is the abnormal distribution.

The random data generator 220 may provide the regenerated random data to the operation controller 210 or regenerate the random data in the same manner as previously generated random data.

The bit pattern determiner 230 may generate the random data distribution information based on the random data provided from the random data generator 220. The data distribution information may be information indicating whether the random data is the normal distribution or the abnormal distribution. The bit pattern determiner 230 may provide the generated data distribution information to the random data generator 220.

The restoration data generator (not shown) may generate restoration data based on the random data included in the data from which the selected page is read and the seed corresponding to the random data. The restoration data may be write data corresponding to the random data before being randomized.

The host 300 may communicate with the storage device 50 using one or more of various communication methods such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), a multimedia card (MMC), an embedded MMC (eMMC), a dual in-line memory module (DIMM), a registered DIMM (RDIMM), and a load reduced DIMM (LRDIMM).

Figure 2:
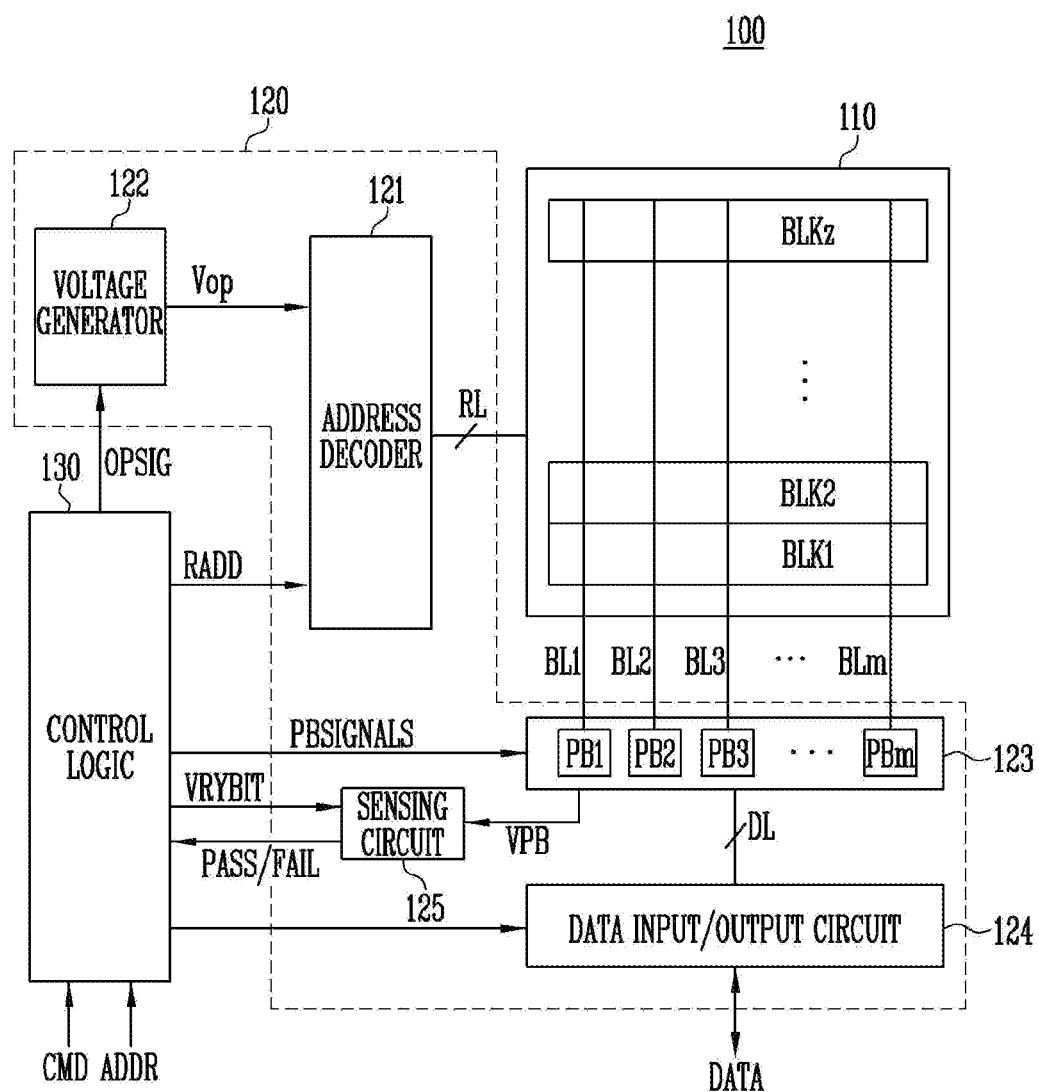
FIG. 2 illustrates block diagram for describing a structure of a memory device of FIG. 1.

FIG. 2 illustrates block diagram for describing a structure of the memory device of FIG. 1. A memory device 100 may include a memory cell array 110, a peripheral circuit 120, and a control logic 130.

The memory cell array 110 includes a plurality of memory blocks BLK1 to BLKz. The plurality of memory blocks BLK1 to BLKz are connected to an address decoder 121 through row lines RL. The plurality of memory blocks BLK1 to BLKz are connected to a read and write circuit 123 through bit lines BL1 to BLm. Each of the plurality of memory blocks BLK1 to BLKz includes a plurality of memory cells. As an embodiment, the plurality of memory cells are non-volatile memory cells. Memory cells connected to the same word line among the plurality of memory cells are defined as one physical page. That is, the memory cell array 110 is configured of a plurality of physical pages. According to an embodiment of the present disclosure, each of the plurality of memory blocks BLK1 to BLKz included in the memory cell array 110 may include a plurality of dummy cells. At least one of the dummy cells may be connected in series between a drain select transistor and the memory cells and between a source select transistor and the memory cells.

Each of the memory cells of the memory device 100 may be configured as a single level cell (SLC) that stores one data bit, a multi-level cell (MLC) that stores two data bits, a triple level cell (TLC) that stores three data bits, or a quad level cell (QLC) that stores four data bits The peripheral circuit 120 may include an address decoder 121, a voltage generator 122, the read and write circuit 123, a data input/output circuit 124, and a sensing circuit 125.

The peripheral circuit 120 drives the memory cell array 110. For example, the peripheral circuit 120 may drive the memory cell array 110 to perform a program operation, a read operation, and an erase operation.

The address decoder 121 is connected to the memory cell array 110 through the row lines RL. The row lines RL may include drain select lines, word lines, source select lines, and a common source line. According to an embodiment of the present disclosure, the word lines may include normal word lines and dummy word lines. According to an embodiment of the present disclosure, the row lines RL may further include a pipe select line.

In an embodiment, the row lines RL may be local lines included in local line groups. The local line group may correspond to one memory block. The local line group may include the drain select line, local word lines, and the source select line.

The address decoder 121 is configured to operate in response to control of the control logic 130. The address decoder 121 receives an address ADDR from the control logic 130.

The address decoder 121 is configured to decode a block address of the received address ADDR. The address decoder 121 selects at least one memory block among the memory blocks BLK1 to BLKz according to the decoded block address. The address decoder 121 is configured to decode a row address RADD of the received address ADDR. The address decoder 121 may select at least one word line of a selected memory block by applying voltages supplied from the voltage generator 122 to at least one word line WL according to the decoded row address RADD.

During the program operation, the address decoder 121 may apply a program voltage to a selected word line and apply a pass voltage having a level less than that of the program voltage to unselected word lines. During a program verify operation, the address decoder 121 may apply a verify voltage to the selected word line and apply a verify pass voltage having a level greater than that of the verify voltage to the unselected word lines.

During the read operation, the address decoder 121 may apply a read voltage to the selected word line and apply a read pass voltage having a level greater than that of the read voltage to the unselected word lines.

According to an embodiment of the present disclosure, the erase operation of the memory device 100 is performed in memory block units. The address ADDR input to the memory device 100 during the erase operation includes a block address. The address decoder 121 may decode the block address and select one memory block according to the decoded block address. During the erase operation, the address decoder 121 may apply a ground voltage to the word lines input to the selected memory block.

According to an embodiment of the present disclosure, the address decoder 121 may be configured to decode a column address of the transferred address ADDR. The decoded column address may be transferred to the read and write circuit 123. As an example, the address decoder 121 may include a component such as a row decoder, a column decoder, and an address buffer.

The voltage generator 122 is configured to generate a plurality of operation voltages Vop by using an external power voltage supplied to the memory device 100. The voltage generator 122 operates in response to the control of the control logic 130.

As an example, the voltage generator 122 may generate an internal power voltage by regulating the external power voltage. The internal power voltage generated by the voltage generator 122 is used as an operation voltage of the memory device 100.

As an embodiment, the voltage generator 122 may generate the plurality of operation voltages Vop using the external power voltage or the internal power voltage. The voltage generator 122 may be configured to generate various voltages required by the memory device 100. For example, the voltage generator 122 may generate a plurality of erase voltages, a plurality of program voltages, a plurality of pass voltages, a plurality of selection read voltages, and a plurality of non-selection read voltages.

In order to generate the plurality of operation voltages Vop having various voltage levels, the voltage generator 122 may include a plurality of pumping capacitors that receive the internal voltage and selectively activate the plurality of pumping capacitors to generate the plurality of operation voltages Vop.

The plurality of generated operation voltages Vop may be supplied to the memory cell array 110 by the address decoder 121.

The read and write circuit 123 includes first to m-th page buffers PB1 to PBm. The first to m-th page buffers PB1 to PBm are connected to the memory cell array 110 through first to m-th bit lines BL1 to BLm, respectively. The first to m-th page buffers PB1 to PBm operate in response to the control of the control logic 130.

The first to m-th page buffers PB1 to PBm communicate data DATA with the data input/output circuit 124. To program memory cells, the first to m-th page buffers PB1 to PBm receive the data DATA to be stored through the data input/output circuit 124 and data lines DL.

During a program operation, when a program pulse is applied to the selected word line, the first to m-th page buffers PB1 to PBm may transfer the data DATA to be stored, that is, the data DATA received through the data input/output circuit 124 to the selected memory cells through the bit lines BL1 to BLm. The memory cells of the selected page are programmed according to the transferred data DATA. A memory cell connected to a bit line to which a program permission voltage (for example, a ground voltage) is applied may have an increased threshold voltage. A threshold voltage of a memory cell connected to a bit line to which a program inhibition voltage (for example, a power voltage) is applied may be maintained. During a program verify operation, the first to m-th page buffers PB1 to PBm read the data DATA stored in the memory cells from the selected memory cells through the bit lines BL1 to BLm.

During a read operation, the read and write circuit 123 may read the data DATA from the memory cells of the selected page through the bit lines BL and store the read data DATA in the first to m-th page buffers PB1 to PBm.

During an erase operation, the read and write circuit 123 may float the bit lines BL. As an embodiment, the read and write circuit 123 may include a column selection circuit.

The data input/output circuit 124 is connected to the first to m-th page buffers PB1 to PBm through the data lines DL. The data input/output circuit 124 operates in response to the control of the control logic 130.

The data input/output circuit 124 may include a plurality of input/output buffers (not shown) that receive input data DATA. During the program operation, the data input/output circuit 124 receives the data DATA to be stored from an external controller (not shown). During the read operation, the data input/output circuit 124 outputs the data DATA transferred from the first to m-th page buffers PB1 to PBm included in the read and write circuit 123 to the external controller.

During the read operation or the verify operation, the sensing circuit 125 may generate a reference current in response to a signal of a permission bit VRYBIT generated by the control logic 130 and may compare a sensing voltage VPB received from the read and write circuit 123 with a reference voltage generated by the reference current to output a pass signal or a fail signal to the control logic 130.

The control logic 130 may be connected to the address decoder 121, the voltage generator 122, the read and write circuit 123, the data input/output circuit 124, and the sensing circuit 125. The control logic 130 may be configured to control all operations of the memory device 100. The control logic 130 may operate in response to a command CMD transferred from an external device.

The control logic 130 may generate various signals in response to the command CMD and the address ADDR to control the peripheral circuit 120. For example, the control logic 130 may generate an operation signal OPSIG, the row address RADD, a read and write circuit control signal PBSIGNALS, and the permission bit VRYBIT in response to the command CMD and the address ADDR. The control logic 130 may output the operation signal OPSIG to the voltage generator 122, output the row address RADD to the address decoder 121, output the read and write control signal to the read and write circuit 123, and output the permission bit VRYBIT to the sensing circuit 125. In addition, the control logic 130 may determine whether the verify operation is passed or failed in response to the pass or fail signal PASS/FAIL output by the sensing circuit 125.

Figure 3:
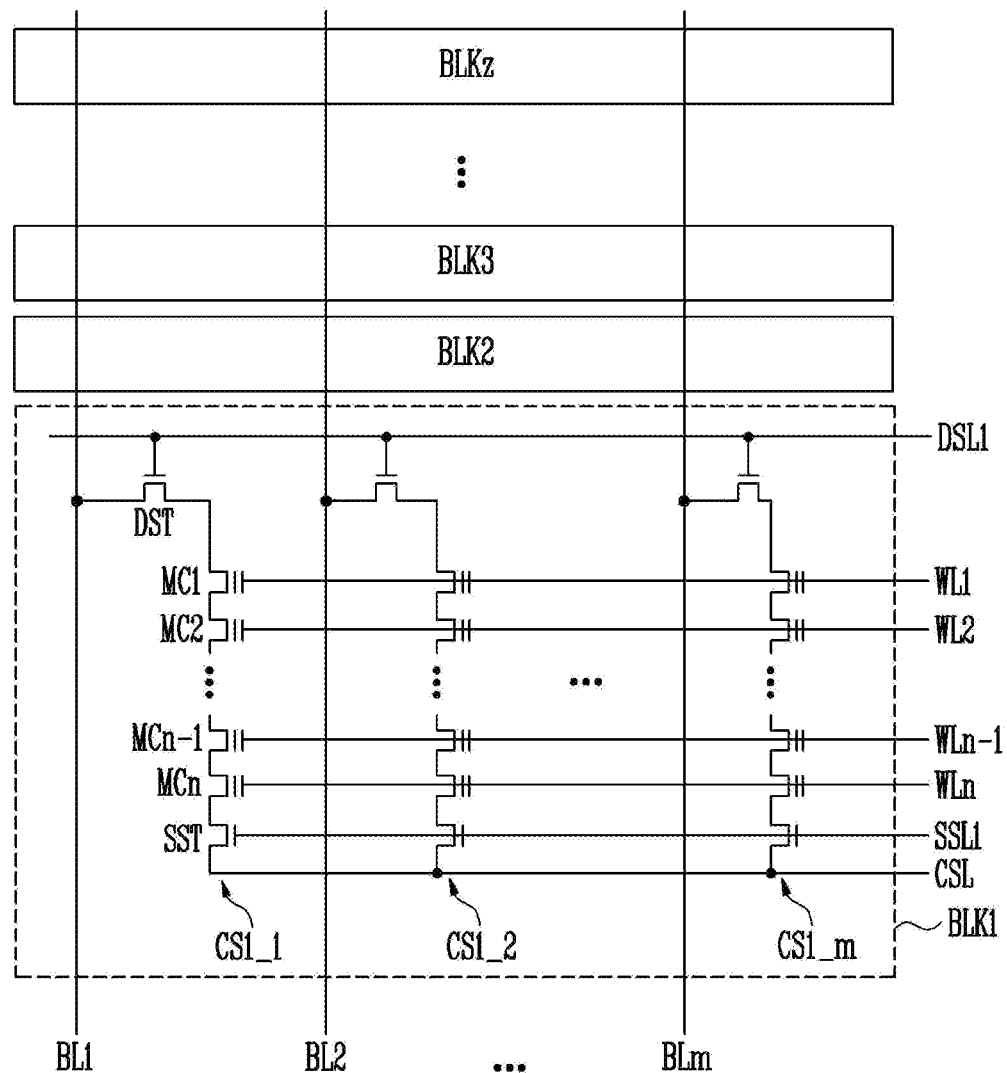
FIG. 3 illustrates a diagram for describing a memory cell array of FIG. 2.

FIG. 3 illustrates a diagram for describing the memory cell array 110 of FIG. 2. The first to z-th memory blocks BLK1 to BLKz are commonly connected to the first to m-th bit lines BL1 to BLm. In FIG. 3, for convenience of description, elements included in the first memory block BLK1 of the plurality of memory blocks BLK1 to BLKz are shown, and elements included in each of the remaining memory blocks BLK2 to BLKz are omitted. It will be understood that each of the remaining memory blocks BLK2 to BLKz is configured similarly to the first memory block BLK1.

The first memory block BLK1 may include a plurality of cell strings CS1_1 to CS1_m (m is a positive integer). The first to m-th cell strings CS1_1 to CS1_m are connected to the first to m-th bit lines BL1 to BLm, respectively. Each of the first to m-th cell strings CS1_1 to CS1_m includes a drain select transistor DST, a plurality of memory cells MC1 to MCn connected in series (n is a positive integer), and a source select transistor SST.

Gate terminals of the drain select transistors DST respectively included in each of the first to m-th cell strings CS1_1 to CS1_m are connected to a drain select line DSL1. Gate terminals of the first to n-th memory cells MC1 to MCn respectively included in the first to m-th cell strings CS1_1 to CS1_m are connected to first to the n-th word lines WL1 to WLn, respectively. Gate terminals of the source select transistors SST respectively included in the first to m-th cell strings CS1_1 to CS1_m are connected to a source select line SSL1.

For convenience of description, a structure of the cell string will be described with reference to the first cell string CS1_1 of the plurality of cell strings CS1_1 to CS1_m. However, it will be understood that each of the remaining cell strings CS1_2 to CS1_m is configured similarly to the first cell string CS1_1.

A drain terminal of the drain select transistor DST included in the first cell string CS1_1 is connected to the first bit line BL1. A source terminal of the drain select transistor DST included in the first cell string CS1_1 is connected to a drain terminal of the first memory cell MC1 included in the first cell string CS1_1. The first to n-th memory cells MC1 to MCn are connected in series with each other. A drain terminal of the source select transistor SST included in the first cell string CS1_1 is connected to a source terminal of the n-th memory cell MCn included in the first cell string CS1_1. A source terminal of the source select transistor SST included in the first cell string CS1_1 is connected to a common source line CSL. As an embodiment, the common source line CSL may be commonly connected to the first to z-th memory blocks BLK1 to BLKz.

The drain select line DSL1, the first to n-th word lines WL1 to WLn, and the source select line SSL1 are included in row lines RL of FIG. 2. The drain select line DSL1, the first to n-th word lines WL1 to WLn, and the source select line SSL1 are controlled by the address decoder 121. The common source line CSL is controlled by the control logic 130. The first to m-th bit lines BL1 to BLm are controlled by the read and write circuit 123.

FIG. 4A to FIG. 4C are diagrams for describing a threshold voltage distribution according to the number of data bits stored in a memory cell. A horizontal axis of each graph represents a magnitude of the threshold voltage and a vertical axis represents the number of memory cells.

FIG. 4A to FIG. 4C will be described under an assumption that the number of data bits stored in one memory cell is one to three. The number of data bits stored in one memory cell is not limited to the present embodiment.

FIG. 4A shows the threshold voltage distribution of a single level cell (SLC) in which one memory cell stores one data bit. The single level cell may have any one of an erase state E or a program state P1.

A read voltage Va1 may be a read voltage for distinguishing the erase state E and the program state P1. The single level cell having the erase state E may be read to an ON cell at a time of reading with the read voltage Va1, where on the ON cell corresponding to a logical value '1'. The single level cell having the program state P1 may be read to an OFF cell at the time of reading with the read voltage Va1, where the OFF cell corresponding to a logical value '0'.

FIG. 4B shows the threshold voltage distribution of a multi-level cell (MLC) in which one memory cell stores two data bits. The multi-level cell may have any one of the erase state E and first to third program states P1 to P3.

First to third read voltages Vb1 to Vb3 may be read voltages for distinguishing the erase state E or the first to third program states P1 to P3, respectively. For example, the first read voltage Vb1 may be a read voltage for distinguishing the erase state E and the first program state P1. The second read voltage Vb2 may be a read voltage for distinguishing the first program state P1 and the second program state P2. The third read voltage Vb3 may be a read voltage for distinguishing the second program state P2 and the third program state P3.

The multi-level cell may be divided into any one of the erase state E or the first to third program states P1 to P3 according to a result of reading with the first to third read voltages Vb1 to Vb3.

Each of the erase state E or the first to third program states P1 to P3 may correspond to logical data '11', '01', '00', and '10'. The logical data corresponding to each state is not limited to the present embodiment.

Logical pages corresponding to word lines connected to the multi-level cells may be a most significant bit (MSB) page and a least significant bit (LSB) page. The MSB page may be a page storing the most significant bit of the two data bits stored in the multi-level cell. The LSB page may be a page storing the least significant data bit of the two data bits stored in the multi-level cell.

Since the multi-level cell is programmed to have any one of the erase state E or the first to third program states P1 to P3, there is a difference in a data storage method between the single level cell and the multi-level cell.

FIG. 4C shows the threshold voltage distribution of a triple level cell (TLC) in which one memory cell stores three data bits. The triple level cell may have any one of the erase state E or the first to seventh program states P1 to P7.

First to seventh read voltages Vc1 to Vc7 may be read voltages for distinguishing the erase state E or the first to seventh program states P1 to P7, respectively. The first read voltage Vc1 may be a read voltage for distinguishing the erase state E and the first program state P1. The second read voltage Vc2 may be a read voltage for distinguishing the first program state P1 and the second program state P2. In the same manner, the seventh read voltage Vc7 may be a read voltage for distinguishing the sixth program state P6 and the seventh program state P7.

The triple level cell may be divided into any one of the erase state E or the first to seventh program states P1 to P7 according to a result of reading with first to seventh read voltages Vc1 to Vc7.

Each of the erase state E or the first to seventh program states P1 to P7 may correspond to logical data '111', '110', '100', '000', '010', '011', '001, and '101'. The logical data corresponding to each state is not limited to the present embodiment.

Logical pages corresponding to word lines connected to the triple level cells may be an MSB page, a central significant bit (CSB) page, and an LSB page. The MSB page may be a page storing the most significant bit among the three data bits stored in the triple level cell. The CSB page may be a page storing an intermediate data bit among the three data bits stored in the triple level cell. The LSB page may be a page storing the least significant data bit among the three data bits stored in the triple level cell.

Since the triple level cell is programmed to have any one of the erase state E or the first to seventh program states P1 to P7, there is a difference in a data storage method between the single level cell or the multi-level cell and the triple level cell. That is, even the same memory cell may be divided into a single level cell, a multi-level cell, or a triple level cell according to a data storage method.

As the number of data bits stored by each memory cell increases, the number of erase states and program states that the memory cell may have may increase.

FIG. 5 illustrates a block diagram for describing a configuration and an operation of the memory controller of FIG. 1 according to an embodiment. The memory controller 200 may include an operation controller 210, a random data generator 220, and a bit pattern determiner 230.

The operation controller 210 may receive a write request and write data from a host 300. The operation controller 210 may receive a logical address of the write data from the host 300.

The operation controller 210 may convert the logical address of the write data into a physical address where the write data is to be stored. Specifically, the operation controller 210 may provide the write data and a physical address of a page to be selected in which the write data is to be stored, to the random data generator 220.

The operation controller 210 may provide a program command for storing program data in a selected page to the memory device 100. The program data may include random data generated by the random data generator 220 and a seed corresponding to the random data.

The random data generator 220 may generate the seed based on the physical address provided from the operation controller 210. The random data generator 220 may generate the random data based on the write data and a first seed.

The random data generator 220 may provide the generated random data to the bit pattern determiner 230. The random data generator 220 may obtain data distribution information of the random data from the bit pattern determiner 230. The data distribution information may be information indicating whether the random data is a normal distribution (or first distribution type or first type) or an abnormal distribution (or second distribution type or second type).

The random data generator 220 may regenerate the random data based on the write data and a second seed according to the data distribution information. The second seed may be a seed different from the seed (first seed) used in generating previous random data.

Specifically, when the random data is the normal distribution, the random data generator 220 may provide the generated random data to the operation controller 210. The random data generator 220 may provide the seed corresponding to the random data together with the random data to the operation controller 210. The seed corresponding to the random data may be a seed used for generating the corresponding random data.

When the random data is the abnormal distribution, the random data generator 220 may regenerate the random data based on the write data and the second seed.

The random data generator 220 may provide the regenerated random data to the bit pattern determiner 230. The random data generator 220 may receive the data distribution information of the regenerated random data from the bit pattern determiner 230. The random data generator 220 may determine whether the regenerated random data is the normal distribution or the abnormal distribution based on the received data distribution information.

When the regenerated random data is the normal distribution, the random data generator 220 may provide the regenerated random data and the seed corresponding to regenerated random data to the operation controller 210. In other words, the random data generator 220 may provide the regenerated random data and the second seed to the operation controller 210.

When the regenerated random data is the abnormal distribution, the random data generator 220 may regenerate the random data based on the write data and a third seed different from the second seed.

In an embodiment, the number of times the random data generator 220 may regenerate random data may be based on a threshold number (e.g., the regeneration of random data may be performed no more than the threshold number). When the iteration of the regeneration of the random data equals the threshold number, the random data generator 220 may provide the most recently generated random data and a seed corresponding to the random data to the operation controller 210 regardless of the data distribution information.

In an embodiment, the random data generator 220 may include a seed generator 221 and a randomizer 222. The seed generator 221 may generate a seed based on a physical address of a page in which data is to be stored. The randomizer 222 may perform a logical operation (e.g., an exclusive OR operation) on the write data and the seed to generate the random data.

The bit pattern determiner 230 may generate the data distribution information based on the random data. The data distribution information may be information indicating whether the random data is the normal distribution or the abnormal distribution.

The bit pattern determiner 230 may operate a distribution ratio of bit patterns of the random data. Specifically, the bit pattern determiner 230 may operate a distribution ratio of bit patterns corresponding to an erase state and program states, respectively, among bits included in the random data.

The number of erase states and program states may be determined according to the number of data bits the memory cell stores as described with reference to FIG. 4A to FIG. 4C. A bit pattern (or a logical data value) corresponding to each state may be variously set.

The bit pattern determiner 230 may determine whether a difference value between a distribution ratio of the bit patterns of the random data and a reference distribution ratio is within an error range. The bit pattern determiner 230 may set the reference distribution ratio according to the number of data bits the memory cell stores.

For example, when the memory cell is a single level cell storing one data bit, since the memory cell is distributed in the erase state and the program state (total of two states), the bit pattern determiner 230 may set the reference distribution ratio to 50%.

The bit pattern determiner 230 may set a ratio (e.g., a predetermined ratio) of the reference distribution ratio to the error range.

For example, when the reference distribution ratio is assumed to be 50%, the bit pattern determiner 230 may set 5%, which is 10% of the reference distribution ratio, to an error range. Therefore, when the distribution ratio of the bit patterns of the random data is between 45% and 55%, the bit pattern determiner 230 may determine that the distribution ratio of the bit patterns is within the error range based on the reference distribution ratio.

When the distribution ratio of the bit patterns of the random data is within the error range, the bit pattern determiner 230 may determine that the random data has the normal distribution. When the distribution ratio of the bit patterns of the random data is outside of the error range, the bit pattern determiner 230 may determine that the random data has the abnormal distribution.

The bit pattern determiner 230 may generate the data distribution information of the random data based on a determination result. The bit pattern determiner 230 may provide the generated data distribution information to the random data generator 220.

Figure 6:
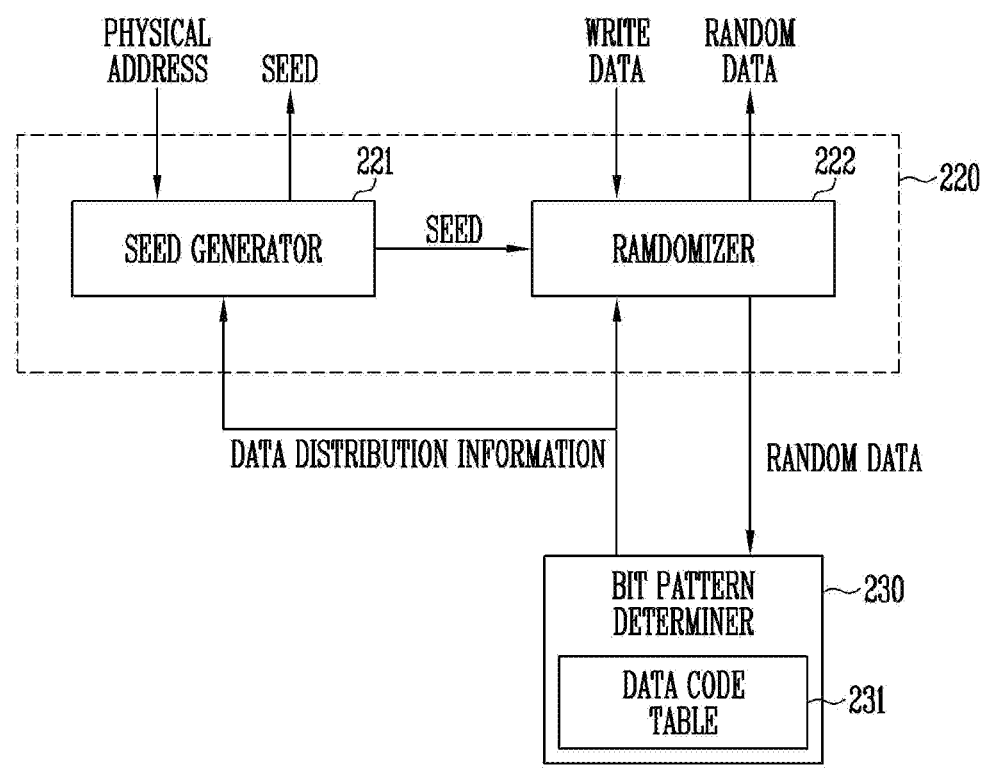
FIG. 6 illustrates a block diagram for describing operations of a random data generator and a bit pattern determiner of FIG. 5.

FIG. 6 illustrates a block diagram for describing operations of the random data generator 220 and the bit pattern determiner 230 of FIG. 5. The random data generator 220 may include a seed generator 221 and a randomizer 222.

The seed generator 221 may generate a seed based on a physical address provided by the operation controller 210 described with reference to FIG. 5. The physical address may be a physical address of a selected page in which write data is to be stored. That is, the seed generator 221 may generate a first seed based on the physical address of the selected page in which the write data is to be stored.

The seed generator 221 may provide the generated first seed to the randomizer 222.

The seed generator 221 may receive data distribution information of random data generated based on the write data and the first seed from a bit pattern determiner 230.

The seed generator 221 may provide the generated first seed to the operation controller when the random data is a normal distribution according to the data distribution information. The seed generator 221 may generate a second seed different from the first seed when the random data is an abnormal distribution. The first seed may be a seed used in generating previous random data.

Specifically, the seed generator 221 may generate the second seed based on a physical address of a page different from the selected page. The second seed may be a seed different from the first seed used in generating the previous random data. The page different from the selected page may be any one of physical pages on which a data write operation is successively performed together with the selected page. The page different from the selected page may be a page that is physically adjacent to the selected page.

In another embodiment, the seed generator 221 may generate the second seed by logically operating the first seed and a preset value in various manners. For example, the seed generator 221 may generate the second seed by adding or subtracting the preset value to or from the first seed or performing an exclusive OR operation on the first seed and the preset value.

The seed generator may provide the generated second seed to the randomizer 222.

The randomizer 222 may generate random data by performing a bit-wise exclusive OR (XOR) operation on the seed provided from the seed generator 221 and the write data provided from the operation controller.

For example, the randomizer 222 may generate the random data by performing the logical operation on the first seed and the write data. The randomizer 222 may generate the random data by performing a logical operation on the second seed and the write data.

The randomizer 222 may provide the generated random data to the bit pattern determiner 230.

The randomizer 222 may provide the generated random data to the operation controller when the random data is the normal distribution according to the data distribution information of the random data.

The bit pattern determiner 230 may include a data code table 231 that stores a data code. The data code may be bit patterns respectively corresponding to the erase state and program states in which the memory cell of the selected page is to be programmed described with reference to FIG. 4A to FIG. 4C.

The bit pattern determiner 230 may generate the data distribution information based on the random data provided from the randomizer 222.

The bit pattern determiner 230 may operate a distribution ratio of the bit patterns respectively corresponding to the erase state and the program state among bits included in the random data based on the data code table 231.

The bit pattern determiner 230 may determine whether a difference value between the distribution ratio of the bit patterns of the random data and a reference distribution ratio is within an error range. The bit pattern determiner 230 may determine that the random data has the normal distribution when the distribution ratio of the bit patterns of the random data is within the error range. The bit pattern determiner 230 may determine that the random data has the abnormal distribution when the distribution ratio of the bit patterns of the random data is out of the error range.

The bit pattern determiner 230 may generate the data distribution information of the random data based on a determination result. The bit pattern determiner 230 may provide the generated data distribution information to the seed generator 221 and the randomizer 222.

FIG. 7 illustrates a diagram for describing a distribution ratio of bit patterns of the data code and the write data of FIG. 6. The data code may be a bit pattern respectively corresponding to an erase state and program states in which a memory cell of a selected page is to be programmed.

The data code may be determined according to the number of the erase states and the program states in which the memory cell is to be programmed. In other words, the data code may be determined according to the number of data bits the memory cell stores.

In FIG. 7, the memory cell of the selected page is assumed to be a multi-level cell storing two data bits. The number of bit patterns that may be expressed by two data bits is four.

Bit patterns respectively corresponding to an erase state E and first to third program states P1 to P3 of the multi-level cell may be set.

The bit pattern may be set in various manners. For example, the bit pattern may be set to a gray code manner in which only one data bit is changed among values of bit patterns corresponding to two adjacent states, respectively.

For example, the bit pattern corresponding to the erase state E may be logical data '11'. The bit pattern corresponding to the first program state P1 may be logical data '01'. The bit pattern corresponding to the second program state P2 may be logical data '00'. The bit pattern corresponding to the third program state P3 may be logical data '10'. The bit pattern corresponding to each state is not limited to the present embodiment.

The distribution ratio of the bit patterns of the write data may be different for each state.

For example, input write data in FIG. 7 may be '0101001010010010001'. The distribution ratio of the bit patterns of the write data are as follows: the erase state E is 0% since there is no "11" state; the first program state P1 is 50% since there are six "01" states; the second program state P2 is 25% since there are three "00" states; the third program state P3 is 25% since there are three "10" states.

According to a state in which the memory cells are programmed, an interference effect which affects each other may occur.

For example, referring to the multi-level cell of FIG. 4A to FIG. 4C, the memory cell of the erase state E and the memory cell of the first program state P1 affect each other due to a difference of a threshold voltage distribution between each other. As the difference of the threshold voltage distribution increases, the interference effect between each other may increase. The memory cell of the erase state E may receive a larger interference effect because the difference of the threshold voltage distribution is large when the adjacent memory cell is the third program state P3 than the first program state P1.

Therefore, in order to reduce the interference effect between the memory cells, the difference of the threshold voltage distribution between adjacent memory cells may be reduced. In order to reduce the difference of threshold voltage distribution between the adjacent memory cells, the distribution ratio of the bit patterns corresponding to each state of the write data may be caused to be uniform. The more uniform the distribution ratio of the bit patterns corresponding to each state, the greater a probability that the difference of the threshold voltage distribution between the adjacent memory cells is reduced.

The random data may be data obtained by randomizing the write data using a seed. An unbalanced distribution ratio of the bit patterns corresponding to each state of the write data may be caused to be uniform through randomizing. Since the random data has a uniform distribution ratio of bit patterns corresponding to each state than the write data, the interference effect between memory cells in programming may be improved.

Therefore, when data is stored in the memory cell, the random data may be stored in the memory cell instead of the write data, and when the data is read, the write data may be restored by using the random data and a seed stored in the memory cell.

FIG. 8 illustrates a diagram for describing an operation of determining whether or not random data is abnormal. First random data RD1 may be data obtained by randomizing the write data of FIG. 7 using a seed.

The first random data RD1 may be '1101001011010010110010'. All distribution ratios of bit patterns of the first random data RD1 are 25% for each state: erase state E, the first program state P1, the second program state P2, and the third program state P3. This is the same as a reference distribution ratio of a multi-level cell. Therefore, the first random data RD1 may be determined as a normal distribution.

In an embodiment, the reference distribution ratio may be determined according to the number of data bits stored in a memory cell. Since the number of bit patterns that may be expresses by two data bits is four, the reference distribution ratio may be set to 25% for each state.

In other embodiments, the reference distribution ratios corresponding to each state may be set differently. That is, a reference distribution ratio corresponding to a program state having the highest threshold voltage or a reference distribution ratio corresponding to a program state having the lowest threshold voltage may be set differently. A reference distribution ratio corresponding to at least two program states may be set differently in descending order of a threshold voltage.

Second random data RD2 may be data obtained by randomizing the write data of FIG. 7 using a seed different from the seed corresponding to the first random data RD1.

The second random data RD2 may be '0101001011010010110010'. A distribution ratio of bit patterns of the second random data RD2 is 16.7% for the erase state E, 33.3% for the first program state P1, 25% for the second program state P2, and 25% for the third program state P3.

It may be determined whether the second random data RD2 is abnormal based on a result of comparison between the distribution ratio of the bit patterns corresponding to each state of the second random data RD2 and a reference ratio.

Specifically, it may be determined whether the second random data RD2 is a normal distribution or an abnormal distribution according to whether a difference value between the distribution ratio of the bit patterns and the reference ratio is within an error range. The error range may be set at a given ratio of the reference ratio, e.g., may be a predetermined ratio.

For example, in FIG. 8, the error range may be set to 20% of the reference ratio. In this case, since the reference ratio is 25%, the error range is set to 5%, which is 20% of 25%. Accordingly, when the distribution ratio of the bit patterns corresponding to each state falls between 20% and 30% (or within 5% of 25%), the second random data RD2 is determined to be in a normal distribution.

The distribution ratio corresponding to the erase state E of the second random data RD2 is outside of the error range at 16.7%. Similarly, the distribution ratio corresponding to the first program state P1 of the second random data RD2 is outside of the error range at 33.3%. Therefore, the second random data RD2 is determined to be in an abnormal distribution.

FIG. 9 illustrates a diagram for describing an operation of the seed generator 221 of FIG. 5 according to an embodiment.

A physical address PPN1 may be a physical address of a selected page in which write data Write D1 is to be stored.

In an embodiment, physical addresses PPN1 to PPN3 may be successive physical addresses. In another embodiment, the physical addresses PPN2 and PPN3 may be physical addresses of pages on which a sequential write operation is performed together with the selected page.

A seed Seed1 may be generated based on the physical address PPN1. A seed Seed2 may be generated based on the physical address PPN2. A seed Seed3 may be generated based on the physical address PPN3.

Random data RD1 may be data obtained by randomizing the write data Write D1 using the seed Seed1. Random data RD2 may be data obtained by randomizing the write data Write D1 using the seed Seed2. Random data RD3 may be data obtained by randomizing the write data Write D1 using the seed Seed3.

When the random data RD1 has an abnormal distribution, the random data may be regenerated based on the write data Write D1 and a seed different from the seed Seed1 used in generating the random data RD1.

In an embodiment, the seed different from the seed Seed1 may be any one of the seeds Seed2 and Seed3 generated based on the physical addresses PPN2 and PPN3 of a page different from the selected page. The regenerated random data may be any one of random data RD2 and RD3.

In an embodiment, the random data corresponding to the write data Write D1 may be stored in the selected page. The seed corresponding to the random data may be stored together with the random data in the selected page. The seed corresponding to the random data may be a seed used in generating the random data.

Therefore, the random data RD2 and the seed Seed2 may be stored in the selected page. Alternatively, the random data RD3 and the seed Seed3 may be stored in the selected page.

FIG. 10 illustrates a diagram for describing the operation of the seed generator 221 of FIG. 5 according to another embodiment. A seed Seed1 may be generated based on a physical address PPN1. Random data RD1 may be data obtained by randomizing write data Write D1 using the seed Seed1. When the random data RD1 has an abnormal distribution, the random data may be regenerated based on the write data Write D1 and a seed different from the seed Seed1 used in generating the random data RD1.

In an embodiment, the seed Seed2 different from the seed Seed1 may be generated using the seed Seed1 corresponding to previously random data and a preset value.

The seed Seed2 may be generated by performing a logical operation of the seed Seed1 and the preset value in various manners. For example, the seed Seed2 may be generated by subtracting or adding the preset value from or to the seed Seed1, or by performing an exclusive OR operation (XOR) of the seed Seed1 and the preset value. The types of the logical operation are not limited to those disclosed herein. In another embodiment, the logical operation of the seed Seed1 and the preset value may be performed in a bitwise manner.

Figure 11:
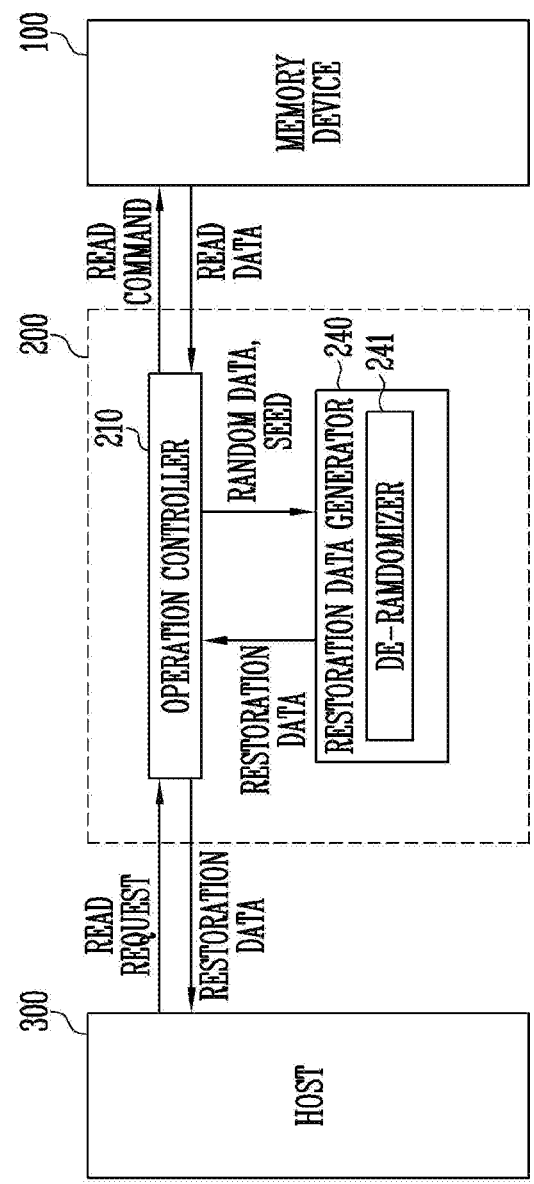
FIG. 11 illustrates a block diagram for describing the configuration and the operation of the memory controller of FIG. 1 according to another embodiment.

FIG. 11 illustrates a block diagram for describing the configuration and the operation of the memory controller of FIG. 1 according to another embodiment. In comparison with FIG. 5, the memory controller 200 may further include a restoration data generator 240.

The operation controller 210 may receive a read request for a selected page from a host 300. The operation controller 210 may provide a read command for reading the selected page to a memory device 100. The operation controller 210 may acquire data from which the selected page is read from the memory device 100.

The operation controller 210 may provide random data included in the read data and a seed corresponding to the random data to the restoration data generator 240. The seed corresponding to the random data may be a seed used in generating the random data.

The operation controller 210 may provide restoration data provided from the restoration data generator 240 to the host 300.

The restoration data generator 240 may generate the restoration data based on random data and a seed provided from the operation controller 210 and provide the restoration data to the operation controller 210.

The restoration data generator 240 may include a DE-randomizer 241.

The DE-randomizer 241 may generate the restoration data by inversely operating the random data and the seed, inversely to the randomizer 222 of FIG. 5. The restoration data may be original data before the random data is randomized.

Figure 12:
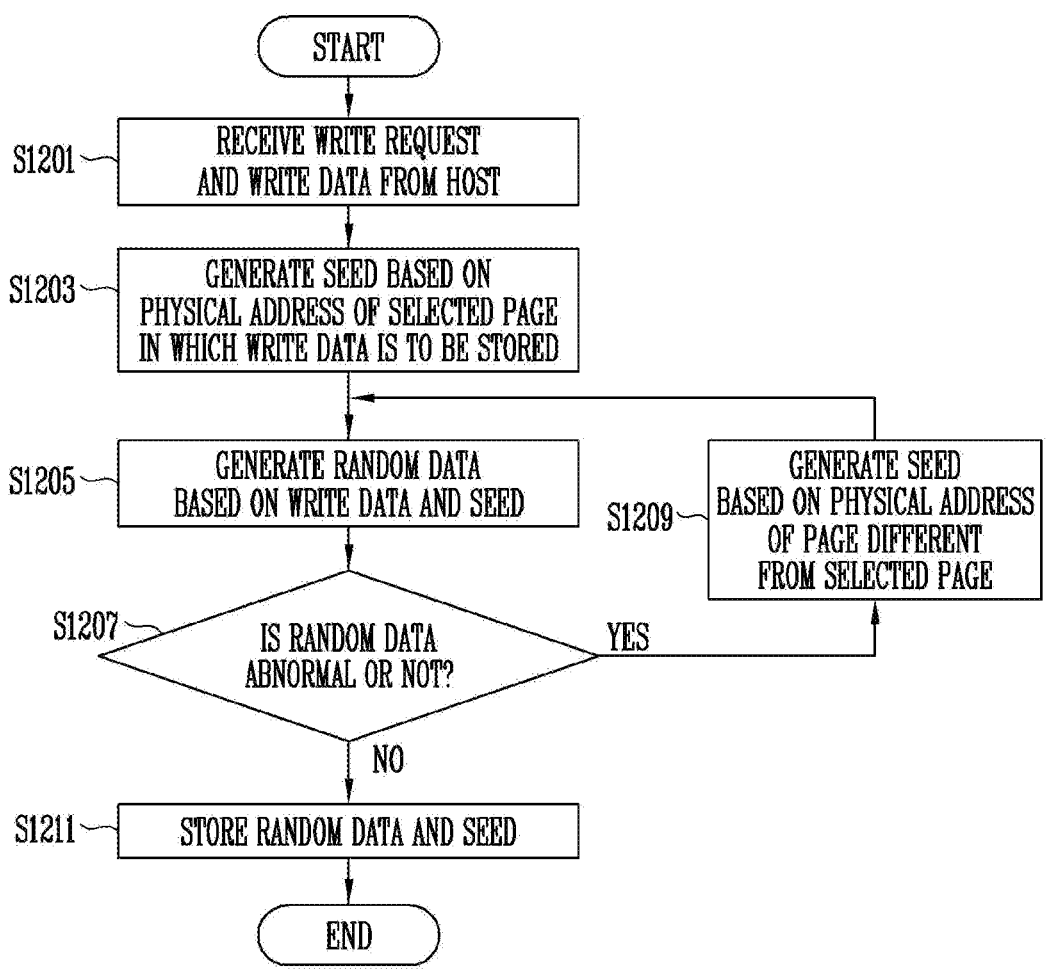
FIG. 12 illustrates a flowchart for describing the operation of the memory controller according to an embodiment.

FIG. 12 illustrates a flowchart for describing the operation of the memory controller according to an embodiment.

In step S1201, the memory controller may receive a write request and write data from a host.

In step S1203, a seed may be generated based on a physical address of a selected page in which the write data is to be stored.

In step S1205, the memory controller may generate random data based on the write data and the seed. Specifically, the memory controller may generate randomized random data by performing a bitwise exclusive OR operation on the write data and the seed.

In step S1207, the memory controller may determine whether or not distribution of the random data is abnormal. The memory controller may determine whether the random data is a normal distribution or an abnormal distribution based on a result of comparison between a distribution ratio of bit patterns of the random data and a reference distribution ratio.

As a result of the determination, when there is no abnormality in the distribution of the random data (when the distribution of the random data is within the normal distribution), the process proceeds to step S1211, and when there is abnormality in the distribution of the random data (when the distribution of the random data is outside of the normal distribution), the process proceeds to step S1209.

In step S1209, the memory controller may generate a new seed different from a previous seed based on a physical address of a page different from the selected page. In various embodiments, the memory controller may generate the new seed using the previous seed and a preset value.

In step S1211, the memory controller may provide a program command for storing the generated random data and the seed in the selected page, to the memory device.

Figure 13:
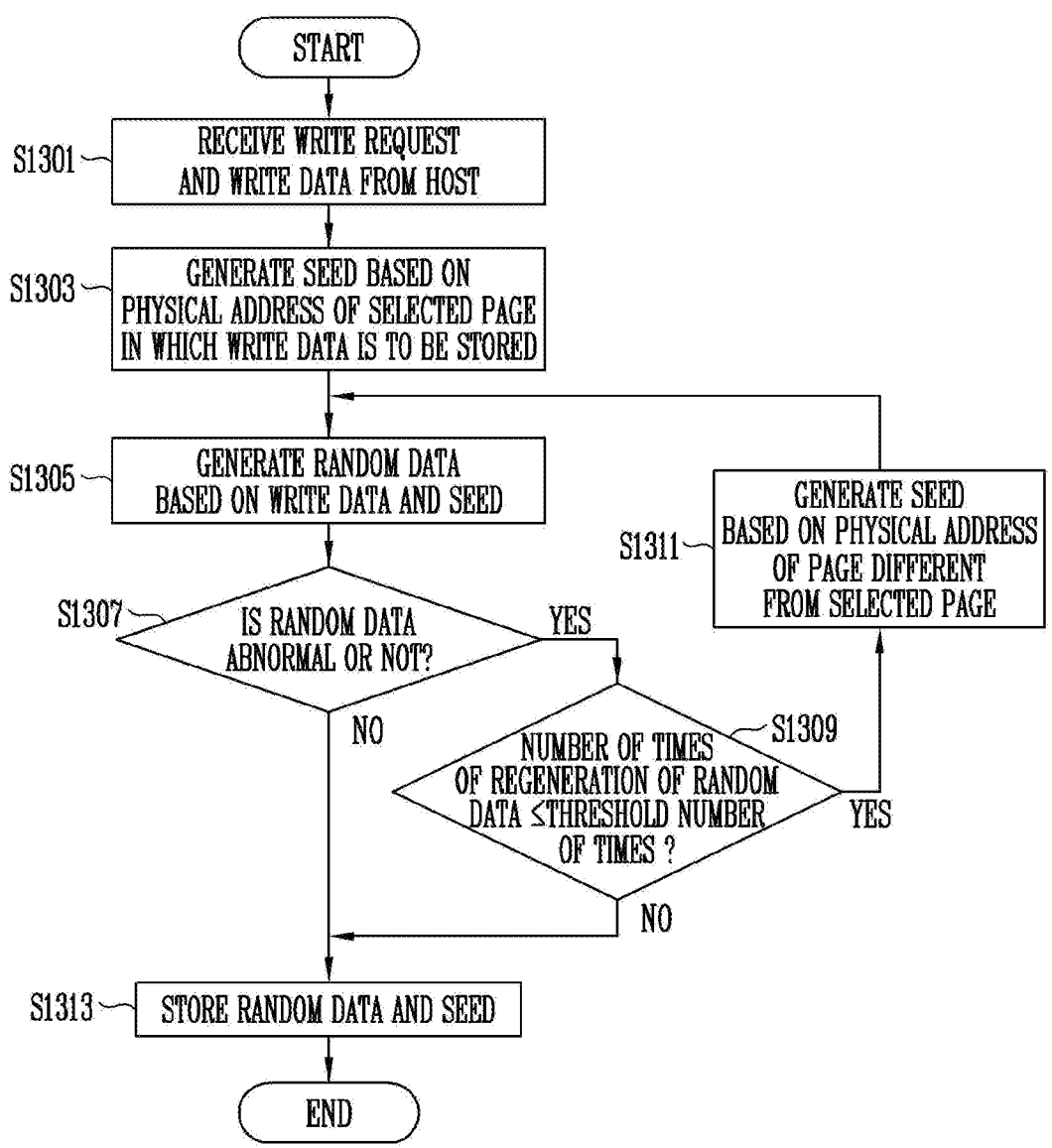
FIG. 13 illustrates a flowchart for describing the operation of the memory controller according to another embodiment.

FIG. 13 illustrates a flowchart for describing the operation of the memory controller according to another embodiment.

In step S1301, the memory controller may receive a write request and write data from a host.

In step S1303, a seed may be generated based on a physical address of a selected page in which the write data is to be stored.

In step S1305, the memory controller may generate random data based on the write data and the seed. Specifically, the memory controller may generate randomized random data performing a bitwise exclusive OR operation on the write data and the seed.

In step S1307, the memory controller may determine whether or not distribution of the random data is abnormal. The memory controller may determine whether the random data is a normal distribution or an abnormal distribution based on a result of comparison between a distribution ratio of bit patterns of the random data and a reference distribution ratio.

As a result of the determination, when there is no abnormality in the distribution of the random data (when the distribution of the random data is the normal distribution), the process proceeds to step S1213, and when there is abnormality in the distribution of the random data (when the distribution of the random data is the abnormal distribution), the process proceeds to step S1309.

In step S1309, the memory controller may determine whether the number of times the random data corresponding to the write data is regenerated is equal to or less than a threshold number of times. As a result of the determination, when the number of times of the regenerations is equal to or less than the threshold number of times, the process proceeds to step S1311, and the number of times of the regenerations is greater than the threshold number of times, the process proceeds to step S1313.

In step S1311, the memory controller may generate a new seed different from a previous seed based on a physical address of a page different from the selected page. In various embodiments, the memory controller may generate the new seed using the previous seed and a preset value.

In step S1313, the memory controller may provide a program command for storing the generated random data and the seed in the selected page, to the memory device.

Figure 14:
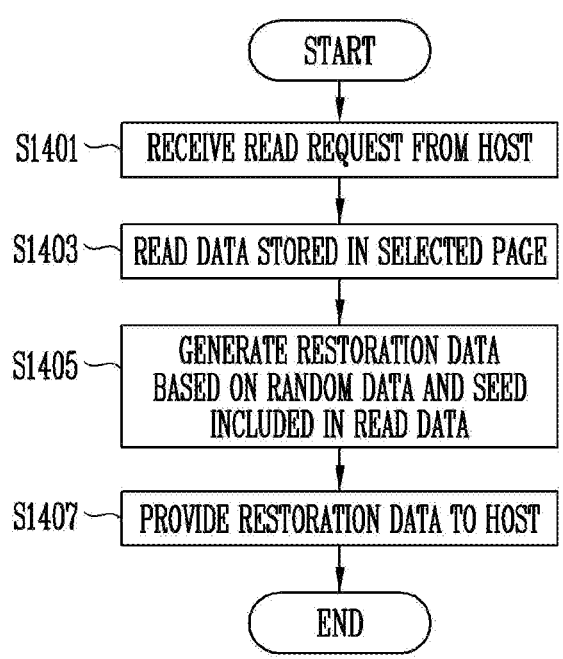
FIG. 14 illustrates a flowchart for describing the operation of the memory controller according to another embodiment.

FIG. 14 illustrates a flowchart for describing the operation of the memory controller according to another embodiment.

In step S1401, the memory controller may receive a read request for a selected page from a host.

In step S1403, the memory controller may provide a read command for reading data stored in the selected page to a memory device.

In step S1405, the memory controller may generate restoration data based on random data and seed included in the read data.

In step S1407, the memory controller may provide the restoration data to the host. The restoration data may be write data to be stored in the selected page provided by the host.

Figure 15:
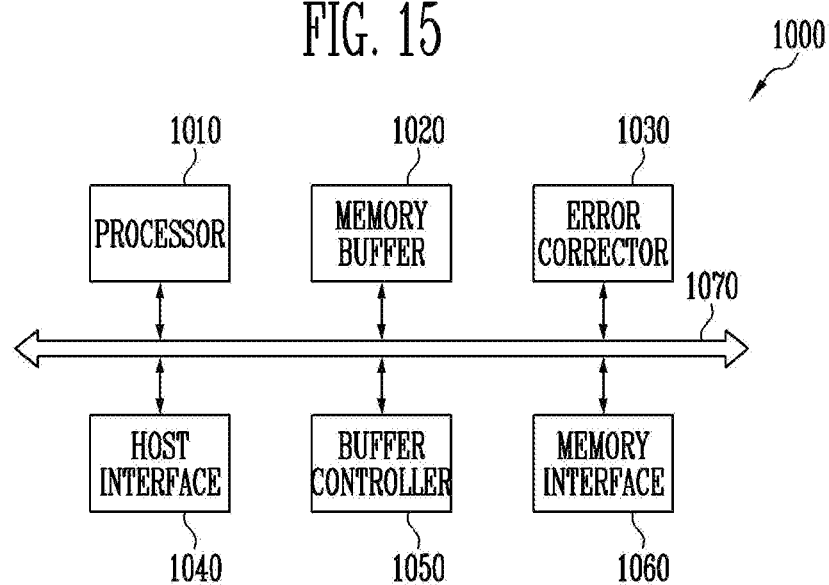
FIG. 15 illustrates a diagram for describing another embodiment of the memory controller of FIG. 1.

FIG. 15 is a diagram for describing another embodiment of the memory controller of FIG. 1.

Referring to FIG. 15, the memory controller 1000 is connected to the host Host and the memory device. The memory controller 1000 is configured to access the memory device in response to the request from the host Host. For example, the memory controller 1000 is configured to control write, read, erase, and background operations of the memory device. The memory controller 1000 is configured to provide an interface between the memory device and the host Host. The memory controller 1000 is configured to drive firmware for controlling the memory device.

The memory controller 1000 may include a processor 1010, a memory buffer 1020, an error corrector (ECC) 1030, a host interface 1040, a buffer control circuit 1050, a memory interface 1060, and a bus 1070.

The bus 1070 may be configured to provide a channel between components of the memory controller 1000.

The processor 1010 may control overall operations of the memory controller 1000 and may perform a logical operation. The processor 1010 may communicate with an external host through the host interface 1040 and communicate with the memory device through the memory interface 1060. In addition, the processor 1010 may communicate with the memory buffer 1020 through the buffer controller 1050. The processor 1010 may control an operation of the storage device using the memory buffer 1020 as an operation memory, a cache memory, or a buffer memory.

The processor 1010 may perform a function of a flash translation layer (FTL). The processor 1010 may convert a logical block address (LBA) provided by the host into a physical block address (PBA) through the flash translation layer (FTL). The flash translation layer (FTL) may receive the logical block address (LBA) using a mapping table and may convert the logical block address (LBA) into the physical block address (PBA). There are various address mapping methods of the flash translation layer, according to a mapping unit. Representative address mapping methods include a page mapping method, a block mapping method, and a hybrid mapping method.

The processor 1010 is configured to randomize data received from the host Host. For example, the processor 1010 may randomize the data received from the host Host using a randomizing seed. The randomized data is provided to the memory device as data to be stored and is programmed to the memory cell array.

The processor 1010 is configured to de-randomize data received from the memory device during the read operation. For example, the processor 1010 may de-randomize the data received from the memory device using a de-randomizing seed. The de-randomized data may be output to the host Host.

As an embodiment, the processor 1010 may perform the randomization and the de-randomization by driving software or firmware.

The memory buffer 1020 may be used as an operation memory, a cache memory, or a buffer memory of the processor 1010. The memory buffer 1020 may store codes and commands executed by the processor 1010. The memory buffer 1020 may store data processed by the processor 1010. The memory buffer 1020 may include a static RAM (SRAM) or a dynamic RAM (DRAM).

The error corrector 1030 may perform error correction. The error corrector 1030 may perform error correction encoding (ECC encoding) based on data to be written to the memory device through memory interface 1060. The error correction encoded data may be transferred to the memory device through the memory interface 1060. The error corrector 1030 may perform error correction decoding (ECC decoding) on the data received from the memory device through the memory interface 1060. As an example, the error corrector 1030 may be included in the memory interface 1060 as a component of the memory interface 1060.

The host interface 1040 is configured to communicate with an external host under control of the processor 1010. The host interface 1040 may be configured to perform communication using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI express), a nonvolatile memory express (NVMe), a universal flash storage (UFS), a secure digital (SD), a multimedia card (MMC), an embedded MMC (eMMC), a dual in-line memory module (DIMM), a registered DIMM (RDIMM), and a load reduced DIMM (LRDIMM).

The buffer controller 1050 is configured to control the memory buffer 1020 under the control of the processor 1010.

The memory interface 1060 is configured to communicate with the memory device under the control of the processor 1010. The memory interface 1060 may communicate a command, an address, and data with the memory device through a channel.

As an example, the memory controller 1000 may not include the memory buffer 1020 and the buffer controller 1050.

As an example, the processor 1010 may control the operation of the memory controller 1000 using codes. The processor 1010 may load the codes from a non-volatile memory device (for example, a read only memory) provided inside the memory controller 1000. As another example, the processor 1010 may load the codes from the memory device through the memory interface 1060.

As an example, the bus 1070 of the memory controller 1000 may be divided into a control bus and a data bus. The data bus may be configured to transmit data within the memory controller 1000 and the control bus may be configured to transmit control information such as a command and an address within the memory controller 1000. The data bus and the control bus may be separated from each other and may not interfere with each other or affect each other. The data bus may be connected to the host interface 1040, the buffer controller 1050, the error corrector 1030, and the memory interface 1060. The control bus may be connected to the host interface 1040, the processor 1010, the buffer controller 1050, the memory buffer 1202, and the memory interface 1060.

Figure 16:
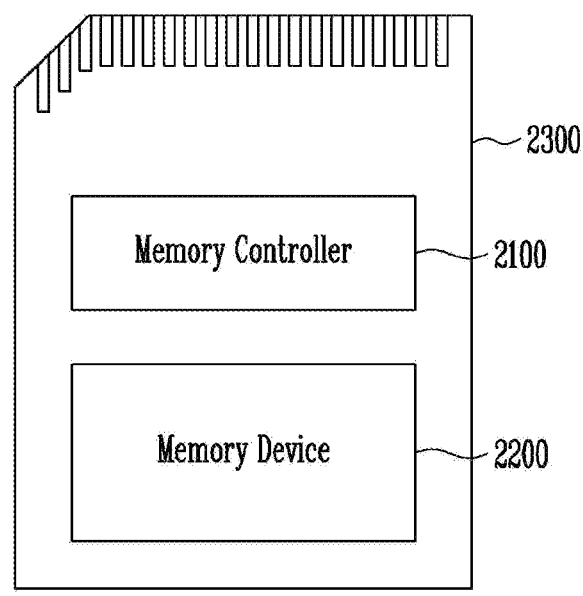
FIG. 16 illustrates a block diagram illustrating a memory card system to which a storage device according to an embodiment of the present disclosure is applied.

FIG. 16 is a block diagram illustrating a memory card system to which a storage device according to an embodiment of the present disclosure is applied.

Referring to FIG. 16, the memory card system 2000 includes a memory controller 2100, a memory device 2200, and a connector 2300.

The memory controller 2100 is connected to the memory device 2200. The memory controller 2100 is configured to access the memory device 2200. For example, the memory controller 2100 may be configured to control read, write, erase, and background operations of the memory device 2200. The memory controller 2100 is configured to provide an interface between the memory device 2200 and the host Host. The memory controller 2100 is configured to drive firmware for controlling the memory device 2200. The memory controller 2100 may be implemented equally to the memory controller 200 described with reference to FIG. 1.

As an example, the memory controller 2100 may include components such as a random access memory (RAM), a processor, a host interface, a memory interface, and an error corrector.

The memory controller 2100 may communicate with an external device through the connector 2300. The memory controller 2100 may communicate with an external device (for example, the host) according to a specific communication standard. As an example, the memory controller 2100 is configured to communicate with an external device through at least one of various communication standards such as a universal serial bus (USB), a multimedia card (MMC), an embedded MMC (MCM), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), Fire-Wire, a universal flash storage (UFS), Wi-Fi, Bluetooth, and an NVMe. As an example, the connector 2300 may be defined by at least one of the various communication standards described above.

As an example, the memory device 2200 may be configured as various non-volatile memory elements such as an electrically erasable and programmable ROM (EEPROM), a NAND flash memory, a NOR flash memory, a phase-change RAM (PRAM), a resistive RAM (ReRAM), a ferroelectric RAM (FRAM), and a spin-torque magnetic RAM (STT-MRAM).

The memory controller 2100 and the memory device 2200 may be integrated into one semiconductor device to configure a memory card. For example, the memory controller 2100 and the memory device 2200 may be integrated into one semiconductor device to configure a memory card such as a PC card (personal computer memory card international association (PCMCIA)), a compact flash card (CF), a smart media card (SM or SMC), a memory stick, a multimedia card (MMC, RS-MMC, MMCmicro, or eMMC), an SD card (SD, miniSD, microSD, or SDHC), and a universal flash storage (UFS).

Figure 17:
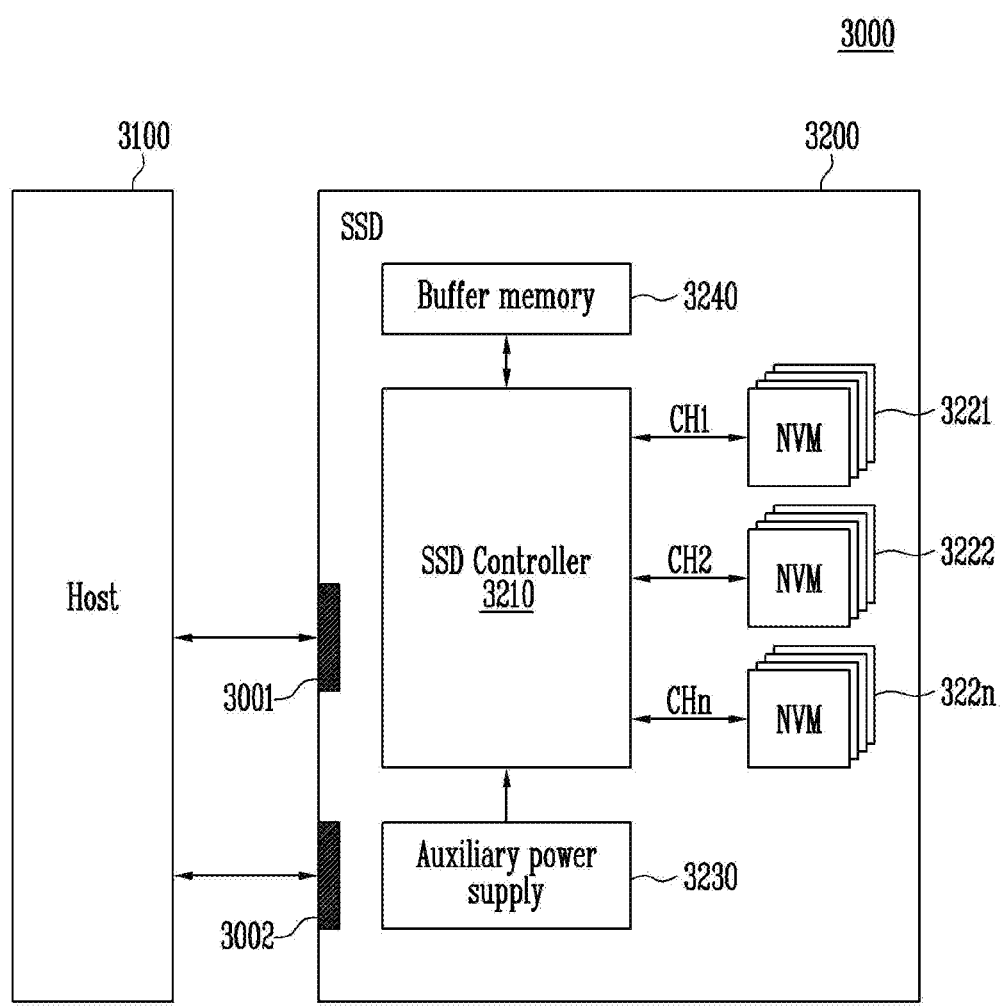
FIG. 17 illustrates a block diagram illustrating a solid state drive (SSD) system to which a storage device according to an embodiment of the present disclosure is applied.

FIG. 17 is a block diagram illustrating a solid state drive (SSD) system to which a storage device according to an embodiment of the present disclosure is applied.

Referring to FIG. 17, the SSD system 3000 includes a host 3100 and an SSD 3200. The SSD 3200 exchanges a signal SIG with the host 3100 through a signal connector 3001 and receives power PWR through a power connector 3002. The SSD 3200 includes an SSD controller 3210, a plurality of flash memories 3221 to 322n, an auxiliary power device 3230, and a buffer memory 3240.

According to an embodiment of the present disclosure, the SSD controller 3210 may perform the function of the memory controller 200 described with reference to FIG. 1.

The SSD controller 3210 may control the plurality of flash memories 3221 to 322n in response to the signal SIG received from the host 3100. As an example, the signal SIG may be signals based on an interface between the host 3100 and the SSD 3200. For example, the signal SIG may be a signal defined by at least one of interfaces such as a universal serial bus (USB), a multimedia card (MMC), an embedded MMC (MCM), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), Fire-Wire, a universal flash storage (UFS), Wi-Fi, Bluetooth, and an NVMe.

The auxiliary power device 3230 is connected to the host 3100 through the power connector 3002. The auxiliary power device 3230 may receive the power PWR from the host 3100 and may charge the power. The auxiliary power device 3230 may provide power of the SSD 3200 when power supply from the host 3100 is not smooth. As an example, the auxiliary power device 3230 may be positioned in the SSD 3200 or may be positioned outside the SSD 3200. For example, the auxiliary power device 3230 may be positioned on a main board and may provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322n, or may temporarily store metadata (for example, a mapping table) of the flash memories 3221 to 322n. The buffer memory 3240 may include a volatile memory such as a DRAM, an SDRAM, a DDR SDRAM, an LPDDR SDRAM, and a GRAM, or a non-volatile memory such as an FRAM, a ReRAM, an STT-MRAM, and a PRAM.

Figure 18:
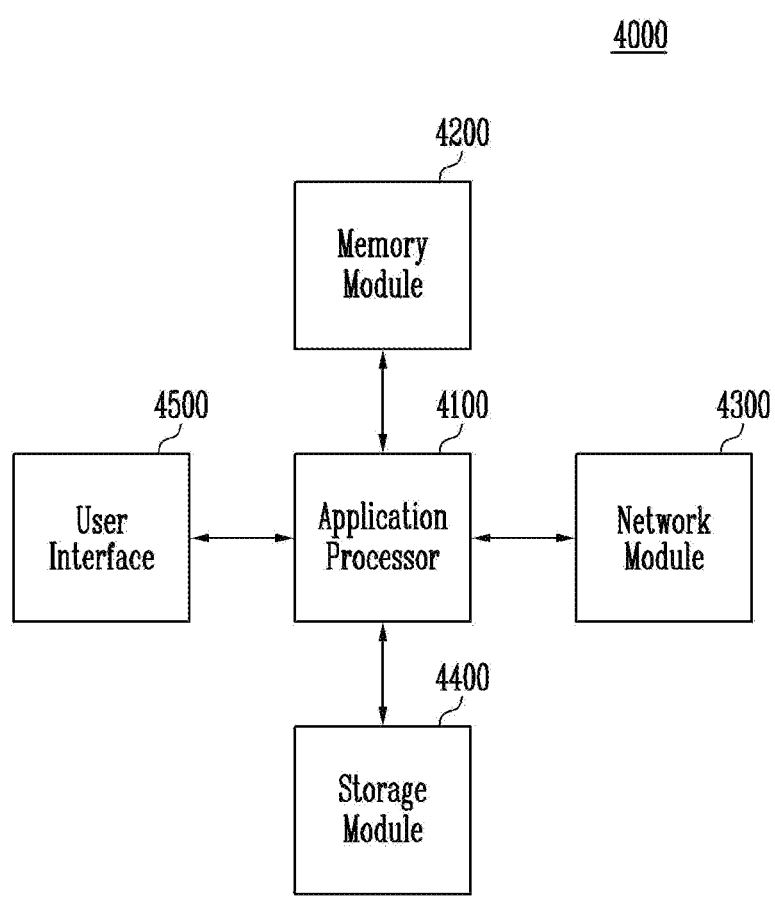
FIG. 18 illustrates a block diagram illustrating a user system to which a storage device according to an embodiment of the present disclosure is applied.

FIG. 18 is a block diagram illustrating a user system to which a storage device according to an embodiment of the present disclosure is applied.

Referring to FIG. 18, the user system 4000 includes an application processor 4100, a memory module 4200, a network module 4300, a storage module 4400, and a user interface 4500.

The application processor 4100 may drive components, an operating system (OS), a user program, or the like included in the user system 4000. As an example, the application processor 4100 may include controllers, interfaces, graphics engines, and the like that control the components included in the user system 4000. The application processor 4100 may be provided as a system-on-chip (SoC).

The memory module 4200 may operate as a main memory, an operation memory, a buffer memory, or a cache memory of the user system 4000. The memory module 4200 may include a volatile random access memory such as a DRAM, an SDRAM, a DDR SDRAM, a DDR2 SDRAM, a DDR3 SDRAM, an LPDDR SDARM, an LPDDR2 SDRAM, and an LPDDR3 SDRAM, or a non-volatile random access memory, such as a PRAM, a ReRAM, an MRAM, and an FRAM. As an example, the application processor 4100 and memory module 4200 may be packaged based on a package on package (POP) and provided as one semiconductor package.

The network module 4300 may communicate with external devices. As an example, the network module 4300 may support wireless communication such as code division multiple access (CDMA), global system for mobile communications (GSM), wideband CDMA (WCDMA), CDMA-2000, time division multiple access (TDMA), long term evolution, Wimax, WLAN, UWB, Bluetooth, and Wi-Fi. As an example, the network module 4300 may be included in the application processor 4100.

The storage module 4400 may store data. For example, the storage module 4400 may store data received from the application processor 4100. Alternatively, the storage module 4400 may transmit data stored in the storage module 4400 to the application processor 4100. As an example, the storage module 4400 may be implemented as a non-volatile semiconductor memory element such as a phase-change RAM (PRAM), a magnetic RAM (MRAM), a resistive RAM (RRAM), a NAND flash, a NOR flash, and a three-dimensional NAND flash. As an example, the storage module 4400 may be provided as a removable storage device (removable drive), such as a memory card, and an external drive of the user system 4000.

As an example, the storage module 4400 may include a plurality of non-volatile memory devices, and the plurality of non-volatile memory devices may operate equally to the memory device 100 described with reference to FIG. 1. The storage module 4400 may operate equally to the storage device 50 described with reference to FIG. 1.

The user interface 4500 may include interfaces for inputting data or an instruction to the application processor 4100 or for outputting data to an external device. As an example, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric element. The user interface 4500 may include user output interfaces such as a liquid crystal display (LCD), an organic light emitting diode (OLED) display device, an active matrix OLED (AMOLED) display device, an LED, a speaker, and a motor.

What is claimed is:

1. A memory controller, comprising:
an operation controller configured to, in response to write data and a logical address being received from a host, output the write data and a physical address of a selected page of a memory device corresponding to the logical address;
a random data generator configured to output first random data based on the write data and a first seed; and
a bit pattern determiner configured to:
obtain a ratio between a number of logical data values corresponding to each of program states from among total logical data values included in the first random data and a number of the total logical data values included in the first random data, as a bit distribution ratio for the first random data, and
output data distribution information indicating whether the first random data is a first type or a second type, based on a comparison between the bit distribution ratio with a reference distribution ratio,
wherein the random data generator is configured to, when the data distribution information indicates that the first random data is the second type, output second random data based on the write data and a second seed,
wherein the operation controller is configured to output the first or second random data, the physical address, and a program command to store the first or second random data in the selected page, and
wherein the second seed is determined based on a physical address of a page different from the selected page, or based on the first seed and a preset value.

2. The memory controller of claim 1, wherein the page and the selected page are target pages on which a sequential write operation is performed.

3. The memory controller of claim 2, wherein the operation controller controls the memory device to obtain read data from a page selected according to a read request, and
wherein the memory controller further comprises a restoration data generator configured to generate restoration data based on random data in the read data and a seed, corresponding to the random data, in the read data.

4. The memory controller of claim 1, wherein the first type is a normal distribution and the second type is an abnormal distribution.

5. The memory controller of claim 1, wherein the operation controller is configured to output the first or second random data, the first or second seed associated with the first or second random data, the physical address, the program command to store the first or second random data, and the first or second seed in the selected page to the memory device.

6. The memory controller of claim 5, wherein the operation controller receives, from the random data generator, the first random data and the first seed when the data distribution information indicates that the first random data is the first type, and the second random data and the second seed when the data distribution information indicates that the first random data is the second type.

7. The memory controller of claim 1, wherein a number of times the random data generator generates random data for the write data is less than or equal to a threshold count.

8. The memory controller of claim 1, wherein the random data generator comprises:
a seed generator configured to generate the first seed based on the physical address of the selected page; and
a randomizer configured to generate the first random data using a logical operation on the first seed and the write data.

9. The memory controller of claim 8, wherein the seed generator generates the second seed when the data distribution information indicates that the first random data is the second type, and
   wherein the randomizer generates the second random data using a logical operation on the second seed and the write data.

10. The memory controller of claim 9, wherein the seed generator generates the second seed based on the physical address of the page different from the selected page.

11. The memory controller of claim 9, wherein the seed generator generates the second seed by performing a logical operation on the first seed with the preset value.

12. The memory controller of claim 1, wherein the bit pattern determiner sets the reference distribution ratio according to a number of data bits stored in a memory cell of the selected page.

13. The memory controller of claim 12, wherein the bit pattern determiner generates the data distribution information based on whether the bit distribution ratio is within an error range of the reference distribution ratio.

14. A method for operating a memory controller, the method comprising:
   receiving write data and a logical address from a host;
   generating first random data based on the write data and a first seed;
   obtaining a ratio between a number of logical data values corresponding to each of program states from among total logical data values included in the first random data and a number of the total logical data values included in the first random data, as a bit distribution ratio for the first random data;
   generating first data distribution information for the first random data based on a comparison between the bit distribution ratio with a reference distribution ratio, the first data distribution information indicating whether the first random data is a first type or a second type;
   if the first data distribution information indicates that the first random data is the second type, generating second random data based on the write data and a second seed; and
   outputting the first or second random data, a physical address corresponding to the logical address, and a program command to store the first or second random data in a first page of a memory device indicated by the physical address to the memory device,
   wherein the second seed is determined based on a physical address of a second page different from the first page, or based on the first seed and a preset value.

15. The method of claim 14, wherein the outputting comprises:
   if the first data distribution information indicates that the first random data is the first type, outputting the first random data, the first seed, the physical address corresponding to the logical address, and a program command to store the first random data and the first seed in the first page to the memory device.

16. The method of claim 14, wherein the outputting comprises:
   if the first data distribution information indicates that the first random data is the second type, generating second data distribution information for the second random data, the second data distribution information indicating that the second random data is the first type or the second type; and
   if the second data distribution information indicates that the second random data is the first type, outputting the second random data, the second seed, the physical address corresponding to the logical address, and a program command to store the second random data and the second seed in the first page to the memory device.

17. The method of claim 14, wherein the generating the first data distribution information comprises:
   determining whether the bit distribution ratio is within an error range of the reference distribution ratio, and
   wherein the reference distribution ratio is determined according to a number of data bits stored in a memory cell of the first page.

18. The method of claim 14, further comprising:
   outputting a read command for the first page to the memory device; and
   generating restoration data based on the first random data in read data from the first page and the first seed.

19. A storage device, comprising:
   a memory device including a plurality of pages; and
   a memory controller configured to:
   generate first random data based on write data to be stored in a selected page among the plurality of pages and a first seed,
   obtain a ratio between a number of logical data values corresponding to each of program states from among total logical data values included in the first random data and a number of the total logical data values included in the first random data, as a bit distribution ratio for the first random data,
   generate data distribution information indicating whether the first random data is a first type or a second type, based on a comparison between the distribution ratio with a reference distribution ratio, and
   generate second random data based on the write data and a second seed when the data distribution information indicates that first random data is the second type, and
   output the first or second random data, and a program command to store the first or second random data in the selected page, to the memory device,
   wherein the second seed is determined based on a physical address of a page different from the selected page, or based on the first seed and a preset value.

20. The storage device of claim 19, wherein the first type is a normal distribution and the second type is an abnormal distribution,
   wherein the memory controller generates the data distribution information based on whether the bit distribution ratio is within an error range of the reference distribution ratio, and
   wherein the reference distribution ratio is determined according to the number of data bits stored in a memory cell of the selected page.

* * * * *